United States Patent [19]

Harada

[11] Patent Number: 4,675,993
[45] Date of Patent: Jun. 30, 1987

[54] ELECTRONIC COMPONENT MOUNTING SYSTEM HAVING A VACUUM SUCTION HEAD WITH A MAGNETIC SENSOR FOR LOCATING AN ELECTRONIC COMPONENT WITH A MAGNET MARK

[75] Inventor: Yoshio Harada, Akita, Japan

[73] Assignee: TDK Corporation, Tokyo, Japan

[21] Appl. No.: 813,666

[22] Filed: Dec. 26, 1985

[30] Foreign Application Priority Data

Dec. 26, 1984 [JP] Japan .................................. 59-272763

[51] Int. Cl.⁴ ............................................. B23P 19/00
[52] U.S. Cl. ....................................... 29/740; 29/743;
29/759; 358/101; 414/752; 901/46
[58] Field of Search .................. 29/739, 740, 742, 743,
29/744, 741, 759; 269/21; 358/101; 414/225,
752, 744 B, 626; 901/6, 40, 46; 294/65.5

[56] References Cited

U.S. PATENT DOCUMENTS 3,341,030  9/1967  Engels ................................ 294/65.5
4,290,732  9/1981  Taki et al. ............................ 29/740
4,494,139  1/1985  Shima et al. ........................ 358/101
4,557,386  12/1985  Buckley et al. ....................... 901/46

Primary Examiner—Frederick R. Schmidt
Assistant Examiner—Robert Showalter
Attorney, Agent, or Firm—Wyatt, Gerber, Shoup, Scobey & Badie

[57] ABSTRACT

System for mounting an electronic component on a printed circuit board comprises a vacuum fastener (4) for picking up an electronic component (2), an image sensor (6) (like a television camera) for taking a picture of the electronic component (2) picked up by said vacuum fastener (4), an image signal processor (7) for providing error signals for compensation of positional error of said electronic component (2) on the vacuum fastener (4), and NC control device (8) for actuating the printed circuit board (10) under the electronic component (2) responsive to said error signals, so that the electronic component (2) is mounted on an accurate location on the printed circuit board (10).

4 Claims, 4 Drawing Figures

ELECTRONIC COMPONENT MOUNTING SYSTEM HAVING A VACUUM SUCTION HEAD WITH A MAGNETIC SENSOR FOR LOCATING AN ELECTRONIC COMPONENT WITH A MAGNET MARK

BACKGROUND OF THE INVENTION

The present invention is concerned with an electronic component mounting system that mounts chip-components which are parts of electronic circuitry on a printed circuit board, in particular, relates to such a system which detects the positional error of a chip-component to be mounted by means of image processing, compensates the error, and mounts the chip-component on a printed circuit board at a correct position. Further the present invention is capable of handling any shape of components.

In the conventional chip-component mounting equipment, positioning of a chip-component being attracted by a vacuum fastener is performed by a mechanical positioning process called "centering" before it is mounted on a printed circuit board. For example, in the electronic component mounting equipment described in Japanese patent laid open publication No. 57-5395, the mounting head has two fastening nails at its tip, one is fixed to it and the other is supported rotatable by an axis that is fixed to that axis. A chip-component to be mounted is fastened by the two fastening nails and then positioning is performed mechanically. Another example is the automatic hybrid circuit board assembling equipment published in Japanese patent laid open publication No. 54-80558, whose positioning device has a pair of locators (each is called X axis line locator and Y axis line locator, respectively) that are supported freely rotatable by its spindle and a chip-component attracted at the tip of the spindle is fastened by the locators' tip parts and positioning is performed mechanically.

In the latter equipment, when a chip-component is positioned, it is mounted on a printed circuit board to which predetermined positions are applied some adhesive in advance for mounting. On the other hand, in the former equipment, a chip-component which is carried from its component supply part is handed over to said mounting head whose tip faces upward. In this condition, positioning is performed as explained. Then, with the chip-component, attracted at its tip, the mounting head begins to rotate downward to a printed circuit board and while rotating some adhesive is applied to the chip-component for mounting purpose. The mounting head stops when the chip-component at its tip faces the printed circuit board, and it is mounted on it as designed.

Also, in either equipment, the mounting head or the spindle, a kind of vacuum fastener, detects whether a chip-component is being attracted at its tip or not by means of vacuum level detection.

In the conventional equipment explained above, however, the following problems are pointed out as drawbacks.

As various kinds of different mechanical fasteners must be prepared for mounting various kinds of chip-component which are of different size and shape. This is not desirable for ease of handling.

In order to have the more precise positioning, the higher accuracy of machine tool technique for mechanical fasteners is required.

Holding or supporting a chip-component mechanically by this kind of fastener may cause the damage or breakage of the chip-component.

A component having protruded terminals like a discrete transistor is hard to be fastened by a fastener of this type.

In addition, in a prior electronic component mounting equipment, a chip-component is first handed over to be mounting head (a kind of fastener). This can cause a chip-component to be dropped before reaching the board.

SUMMARY OF THE INVENTION

It is an object, therefore, of the present invention to overcome the disadvantages and limitations of a prior electronic component mounting system by providing a new and improved system.

It is also an object of the present invention to provide an electronic component mounting system which is capable of mounting any shape of component without damage of a component.

The above and other objects are attained by an electronic component mounting system comprising a vacuum fastener (4) for suctions of an electronic component (2), which is carried on a tape, a carrier (3) which carries said vacuum fastener (4), and moves horizontally, a video camera for taking a picture of said electronic component which is suctioned by said vacuum fastener (4), to provide a signal responsive to location of the component, an image signal processor (7) for providing an error signal according to said signal, an NC control device (8) for providing correction signal for correcting relative relations between a printed circuit board (10) and an electronic component (2), an XY table which carries an printed circuit board (10) on which an electronic component is mounted, and relative position between said electronic component and said printed circuit board being adjusted according to outputs of said NC control device (8).

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Figure 1:
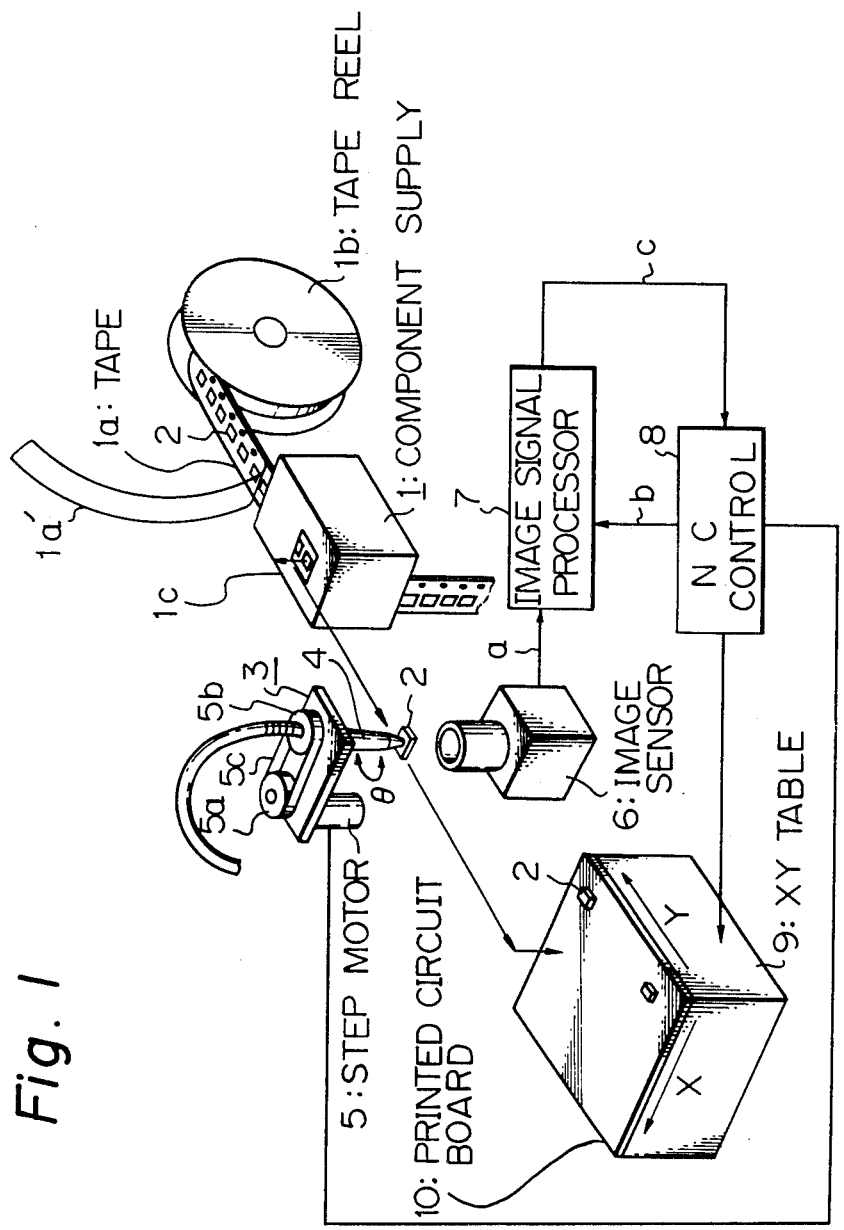
FIG. 1 is a diagram of an electronic component mounting system according to the present invention.

FIG. 1 is a connection diagram showing an embodiment of the invention, i.e., an electronic component mounting system. In FIG. 1, 1 stands for a component supply part which feeds a plural number of chip-components 2 held by tape 1a one by one to take-out window 1c from tape reel 1b at each step of tape 1a's movement. Tape 1a, in turn, is composed of two or three tapes that hold the chip-components firmly between them at nearly equal intervals along the length of tape 1a. At take out window 1c, the upper tape of tape 1a that covers the chip-components is removed so that vacuum fastener 4 to be explained later may take out a chip-componet. Reference numeral 3 stands for a carrier or a mounting part that is supported on a carrying device not shown in FIG. 1, and mounting part 3 is movable both in the horizontal plane and the vertical direction. By means of said carrying device's step motor, whose action is controlled by a signal sent from NC-control device 8, mounting part 3 removes in horizontal plane between the take-out position of component supply part 1 and the mounting position of XY table 9 through the imaging position of imaging device 6. Also, at the take-out position and at the mounting position, mounting part 3 is controlled to be set in up-and-down motion. Mounting part 3 has vacuum fastener 4 that attracts a chip-component by means of air pressure, suction, and a step motor 5 that controls the angular gradient of this vacuum fastener 4 in $\theta$ direction. Vacuum fastener 4 has a tip part at which chip-component 2 is attracted and a photo sensor (not shown in FIG. 1) that detects whether the tip part holds a chip-component or not. In FIG. 1, pulley 5a is fixed on the rotation axis of step motor 5, and pulley 5b is also fixed on the rotation axis on $\theta$ direction of vacuum fastener 4, and by way of belt 5c between these pulleys, the driving force of step motor 5 makes vacuum fastener 4 take a desired angular position that corresponds to a control signal sent from NC-control device 8.

6 stands for an imaging device such as a TV camera, which is located at a predetermined position between the position of component supply part 1 and that of XY table 9 bearing printed circuit board 10 on which chip-components are to be mounted. Imaging device 6 takes a video image of chip-component 2 attracted by vacuum fastener 4 at its tip and sends out the image signal thus obtained as its output. This is denoted by image signal (a). 7 stands for an image signal processor that processes image signal (a) sent from imaging device 6 for measuring the position and the width and the like of chip-component 2, and compares the measurement data with those given by standard signal (b) sent from NC-control device 8 that represent a standard position. Thus, image signal processor 7 detects the positional error of chip-component 2 and sends out correction signal (c) indicating errors in X axis-, Y axis- and $\theta$-directions.

Figure 2:
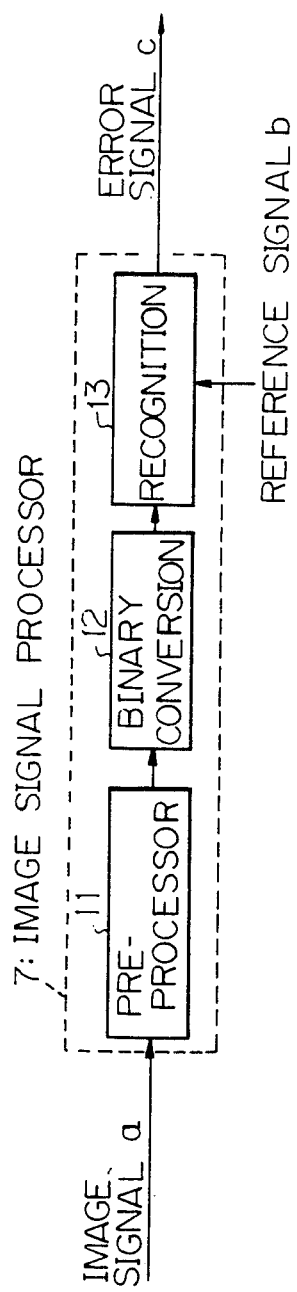
FIG. 2 is a diagram showing the inner structure of the image signal processor of FIG. 1.

FIG. 2 is a block diagram that shows the image signal processor 7. Image signal processor 7 comprises pre-processing part 11, binary image part 12 and discrimination part 13. Pre-processing part 11 amplifies image signal (a) sent from imaging device 6, does required pre-process such as DC-component regeneration, and sends out the result to binary image part 12. Binary image part 12 is composed of a comparator and devices associated with it, that compares the input image signal with a certain slicing level and generates a binary image signal. This binary image signal is sent out to discrimination part 13. Discrimination part 13 calculates the position and the width of chip-component 2 with this binary image signal and a signal obtained from the synchronizing signal of image signal (a). Also, discrimination part 13, with the data of the standard position based on standard signal (b) sent from NC-control device 8 and the calculated data of the position, the width and the like of chip-component 2, performs a "discrimination calculation" which gives the positional error of chip-component 2 in X axis-, Y axis-, and $\theta$-directions, respectively.

The result is sent out as correction signal (c) or an error signal to NC-control deivce 8.

NC-control device 8 controls all the system activities with a control program commanding the mounting sequence and required movement of a chip-component to be mounted, the output signal of the photo sensor of vacuum fastener 4, and correction signal (c) sent from image signal processor 7. That is, NC-control device 8 controls the carrying device's step motor as the control program commands and sets vacuum fastener 4 of mounting part 3 in motion as specified, and it generates mounting direction control signals for step motor 5 and XY table 9 from correction signal c fed by image signal processor 7 and sends them out for mounting direction correction. XY table 9, bearing printed circuit board 10 on its upper surface, has two step motors for controlling X axis movement and Y axis movement respectively that are activated by the corresponding mounting direction control signals sent from NC-control device 8 for position setting.

Let's explain the operation of this embodiment.

First, vacuum fastener 4 of mounting part 3, initially set at a position near component supply part 1, is moved to the take-out position over take-out window 1c of component supply part 1 by a command issued at NC-control device 8 where it is controlled to descend to attract chip-component 2 at its tip part. Upon receiving a signal sent from the photo sensor of vacuum fastener 4 NC-control device 8 verifies that the tip part of vacuum fastener 4 is attracting chip-component 2, and sends a command to the carrying device to continue its carrying action. Thus, vacuum fastener 4 of mounting part 3, with chip-component 2 attracted at its tip part, is controlled to ascend to the take-out position and then to move to the position where video image is taken by imaging device 6. Imaging device 6 takes a video image of the shape and the location of chip-component 2 attracted at the tip part of vacuum fastener 4 and sends out the resulting video signal, i.e., image signal (a), to image signal processor 7. Image signal processor 7 detects the positional error of chip-component 2 with this image signal (a) and standard signal (b) sent from NC-control device 8, and sends out correction signal (c) that indicates correction values in X axis-, Y axis- and $\theta$-directions to NC-control device 8. From correction signal (c), NC-control device 8 adds each correction value to the corresponding command value of the control program to generate mounting direction control signals, which are sent to step motor 5 of mounting part 3, each of the two step motors of XY table 9 respectively. In this way, vacuum fastener 4 of mounting part 3 takes an angular position $\theta$ specified by the corresponding mounting direction control signal by means of step motor 5, and is controlled to move to the mounting position of XY table 9. XY table 9, based on the mounting direction control signals in X axis-direction and Y axis-direction, is moved by means of the two step motors to perform position setting of printed circuit board 10 that is put on its upper surface. Vacuum fastener 4 of mounting part 3, which is at the mounting position of XY table 9, is controlled to descend so that chip-component 2 attracted at its tip part is mounted on a set position of printed circuit board 10 by pressure, to which some adhesive is applied in advance. Then, lowering the air pressure, vacuum fastener 4 is controlled to ascend to the mounting position. Verifying that chip-component 2 is mounted on printed circuit board 10 by the output signal of the photo sensor of vacuum fastener 4, NC-control device 8 sends a command and makes vacuum fastener 4 of mounting part 3 move to the take-out position of component supply part 1. In this operation sequence, vacuum fastener 4 of mounting part 3 takes out a second chip-component, and mounting of it is carried out in the same way as before. Mounting all the chip-components on printed circuit board 10 is performed by repeating the mounting operation sequence explained above.

Figure 3:
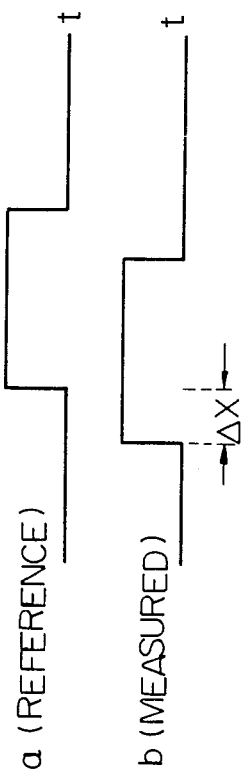
FIG. 3 shows the operaton of the recognition part 13 when the image sensor is a linear CCD (charged coupled device) semiconductor.

FIG. 3 shows the operation of the recognition part 13 (FIG. 2) when the image sensor is a linear CCD (charge coupled device) semiconductor. In that case, a pair of CCD devices which are positioned perpendicular to each other are used, so that both the errors in X-direction and Y-direction are detected. FIG. 3 shows only the detection of error in X-direction. The curve in FIG. 3 shows the output signal of the image sensor 6, in which the horizontal axis shows time, and the vertical axis shows the signal level, and the width W of a pulse relates to a width of an electronic component. The rising edge R, or R' of a pulse indicates the location of an electronic component. That is to say, it is enough to coincide the rising edge R'0 with that R of the reference signal. It is supposed that the information of the reference signal is stored in the image signal processor 7. Therefore, when the measured signal which has the rising edge R' is applied to the image signal processor from the image sensor, the image signal processor 7 compares the time of the rising edge R' of the measured signal with that R of the reference signal. The difference (R'−R) is the error of the location of an electronic component, and the XY table 9 is shifted so that that error is compensated.

As a pair of sensors in perpendicular relations are provided, the errors in both X-direction and Y-direction are compensated.

Figure 4:
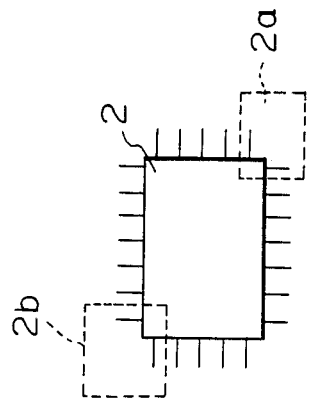
FIG. 4 shows the operation of the camera as it takes a picture of the corners 2a and 2b of semiconductor chip 2.

When a quadratic sensor which can take a picture of a plane like a video camera is used, not only X-direction and Y-direction errors, but also the error of angle of location is detected. In that case, the field of view of the camera is narrow as compared with the size of a component so that the errors is detected correctly. Preferably, the camera takes a picture at a corner of a component. When a component is a semiconductor chip 2, as shown in FIG. 4, the camera takes a picture which covers the corner 2a and/or 2b, which includes a corner of a chip body, and a pair of perpendicular lead lines. A lead line is used for indicating the location of a component, since lead line is bright as compared with a chip body itself. The example of a signal processor 7 for a quadratic sensor is supplied by Tokyo Denshi Kogyo Co. in Japan with the trade name VMS-201. The error of location of a component measured by the image signal processor is applied to the NC control 8 which controls the XY table 9.

In the embodiment explained above, vacuum fastener 4 of mounting part 3 stops at the imaging position in front of imaging device 6 for taking a video image of it, but there may be possible some modifications. For example, if imaging device 6 is a video camera of the one-dimension scanning type, and when vacuum fastener 4 moves with a constant speed over the video camera, its image is obtained. Another example is the case that the imaging device 6 moves with the same speed as that of vacuum fastener 4 and takes video image of it. Still another case is where imaging device 6 is attached on the mounting part 3 and takes a video image of the shape of a chip-component attracted by vacuum fastener 4 at its tip part all the time.

The embodiment explained above shows a case where position setting of chip-component 2 for mounting is performed by means of both vacuum fastener 4 and XY table 9. It is needless to say that position setting can be carried out by means of the vacuum fastener alone, or by means of the XY table alone that is equipped with a facility for use in angular position correction.

In the embodiment explained above, the means for position setting is realized by a simple open loop control with step motors, but a closed loop control with them is also applicable.

As another modification of the invention, each chip-component may have a marker printed with magnetic ink at the center of a component for use in positioning in advance, and a detector for this marker, such as a magnetic sensor, is attached around the vacuum fastener 4, and control is made so that the vacuum fastener 4 may attract the center of chip-component 2. This pre-processing for chip-component mounting makes the positional error of a chip-component smaller to some extent.

As explained above, by means of this invention, chip-components are mounted on a printed circuit board precisely as designed without having them damaged or broken by the mounting process. In addition, an electronic component mounting system is realized in lower cost as the required machine tool technique for it is less precise compared with a conventional one.

From the foregoing it will now be apparent that a new and improved mounting system of an electronic component has been found. It should be understood of course that the embodiments disclosed are merely illustrative and are not intended to limit the scope of the invention. Reference should be made to the appended claims, therefore, rather the specification as indicating the scope of the invention.

What is claimed is:
1. An electronic component mounting system for locating and mounting electronic components on a printed circuit board (10) comprising:
   a vacuum fastener (4) for suction of an electronic component, which component is carried on a tape;
   a carrier (3) which carries said vacuum fastener (4) and moves between a picking up position and a mounting position;
   an image sensor responsive to the image of said electronic component after being sucked and as being held by said vacuum fastener (4) to provide a location signal responsive to location of the component;
   an image signal processor (7) for providing an error signal according to the comparison of said location signal to a standard signal representing a standard location for the component;
   an NC numerical control device (8) connected to said signal processor for providing a correction signal for correcting the relative relation between the printed circuit board (10) and the electronic component (2);
   an XY table controlled in its XY movement by said NC control device and carrying the printed circuit board (10) on which an electronic component is mounted, the relative position between said electronic component and said printed circuit board being adjusted according to outputs of said NC control device (8); and said electronic component having a magnetic mark at a predetermined location, said vacuum fastener having a magnetic sensor so that the electronic component is picked by the vacuum fastener at a predetermined location by coinciding the magnetic sensor with the magnetic mark for preprocessing to locate the electronic component.

2. An electronic component mounting system according to claim 1, wherein said vacuum fastner has an optical source and a photo sensor to detect if an electronic component which prevents optical beam from said source to said sensor, is sucked by the vacuum fastner.

3. An electronic component mounting system according to claim 1, wherein said image sensor is a linear CCD sensor.

4. An electronic component mounting system according to claim 1, wherein said image sensor is a video camera.

* * * * *